(12) United States Patent
Al-Bayati et al.

(10) Patent No.: US 7,879,683 B2
(45) Date of Patent: Feb. 1, 2011

(54) METHODS AND APPARATUS OF CREATING AIRGAP IN DIELECTRIC LAYERS FOR THE REDUCTION OF RC DELAY

(75) Inventors: Amir Al-Bayati, San Jose, CA (US); Alexandros T. Demos, Fremont, CA (US); Kang Sub Yim, Santa Clara, CA (US); Mehul Naik, San Jose, CA (US); Zhenjiang "David" Cui, San Jose, CA (US); Mihaela Balseanu, Sunnyvale, CA (US); Meiyee (Maggie Le) Shek, Palo Alto, CA (US); Li-Qun Xia, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 634 days.

(21) Appl. No.: 11/869,396

(22) Filed: Oct. 9, 2007

(65) Prior Publication Data
US 2009/0093112 A1 Apr. 9, 2009

(51) Int. Cl.
*H01L 21/76* (2006.01)
(52) U.S. Cl. .................. 438/422; 438/411; 438/637; 438/675; 438/700; 257/E21.573; 257/E21.581
(58) Field of Classification Search ......... 438/618–619, 438/622–626, 629, 637, 675, 700, 701, 411, 438/421, 422; 257/522, 774, E21.573, E21.577–E21.579, 257/E21.581, E21.585, E21.587
See application file for complete search history.

(56) References Cited
U.S. PATENT DOCUMENTS
5,461,003 A   10/1995 Havemann et al.

| 5,936,295 A | 8/1999 | Havemann et al. |
| 6,054,379 A | 4/2000 | Yau et al. |
| 6,071,805 A | 6/2000 | Liu |
| 6,093,633 A * | 7/2000 | Matsumoto ................ 438/622 |

(Continued)

OTHER PUBLICATIONS

PCT International Search Report and Written Opinion for International Application No. PCT/US2008/51715 dated May 21, 2008.

(Continued)

*Primary Examiner*—Matthew C Landau
*Assistant Examiner*—Joseph C. Nicely
(74) *Attorney, Agent, or Firm*—Patterson & Sheridan, LLP

(57) ABSTRACT

A method and apparatus for generating air gaps in a dielectric material of an interconnect structure. One embodiment provides a method for forming a semiconductor structure comprising depositing a first dielectric layer on a substrate, forming trenches in the first dielectric layer, filling the trenches with a conductive material, planarizing the conductive material to expose the first dielectric layer, depositing a dielectric barrier film on the conductive material and exposed first dielectric layer, depositing a hard mask layer over the dielectric barrier film, forming a pattern in the dielectric barrier film and the hard mask layer to expose selected regions of the substrate, oxidizing at least a portion of the first dielectric layer in the selected region of the substrate, removing oxidized portion of the first dielectric layer to form reversed trenches around the conductive material, and forming air gaps in the reversed trenches while depositing a second dielectric material in the reversed trenches.

17 Claims, 16 Drawing Sheets

U.S. PATENT DOCUMENTS

| | | | |
|---|---|---|---|
| 6,159,845 A * | 12/2000 | Yew et al. .................. 438/637 |
| 6,165,890 A | 12/2000 | Kohl et al. |
| 6,252,290 B1 * | 6/2001 | Quek et al. ................ 257/522 |
| 6,287,979 B1 | 9/2001 | Zhou et al. |
| 6,380,106 B1 | 4/2002 | Lim et al. |
| 6,403,461 B1 * | 6/2002 | Tae et al. .................... 438/619 |
| 6,451,669 B2 * | 9/2002 | Torres et al. ................ 438/409 |
| 6,753,258 B1 | 6/2004 | Gaillard et al. |
| 6,780,753 B2 | 8/2004 | Latchford et al. |
| 6,790,788 B2 | 9/2004 | Li et al. |
| 6,890,850 B2 | 5/2005 | Lee et al. |
| 6,936,183 B2 | 8/2005 | Chinn et al. |
| 6,984,577 B1 | 1/2006 | Zhao et al. |
| 7,042,095 B2 * | 5/2006 | Noguchi et al. ............. 257/762 |
| 7,060,330 B2 | 6/2006 | Zheng et al. |
| 7,094,689 B2 | 8/2006 | Su et al. |
| 7,098,149 B2 | 8/2006 | Lukas et al. |
| 7,112,526 B2 * | 9/2006 | Okada ........................ 438/622 |
| 7,115,517 B2 | 10/2006 | Ye et al. |
| 7,166,524 B2 | 1/2007 | Al-Bayati et al. |
| 7,205,233 B2 | 4/2007 | Lopatin et al. |
| 7,208,413 B2 | 4/2007 | Byun et al. |
| 7,226,853 B2 | 6/2007 | Bekiaris et al. |
| 7,238,604 B2 | 7/2007 | Kloster et al. |
| 7,449,407 B2 * | 11/2008 | Lur et al. .................... 438/619 |
| 7,553,756 B2 * | 6/2009 | Hayashi et al. ............. 438/622 |
| 2002/0058411 A1 | 5/2002 | Hasegawa et al. |
| 2004/0156987 A1 | 8/2004 | Yim et al. |
| 2005/0124172 A1 | 6/2005 | Townsend, III et al. |
| 2005/0153073 A1 | 7/2005 | Zheng et al. |
| 2005/0215065 A1 | 9/2005 | Nguyen et al. |
| 2005/0230834 A1 | 10/2005 | Schmitt et al. |
| 2005/0233591 A1 | 10/2005 | Schmitt et al. |
| 2006/0043591 A1 | 3/2006 | Yim et al. |
| 2006/0079099 A1 | 4/2006 | Nguyen et al. |
| 2006/0105106 A1 | 5/2006 | Balseanu et al. |
| 2006/0121721 A1 | 6/2006 | Lee et al. |
| 2006/0216926 A1 | 9/2006 | Ye et al. |
| 2007/0099417 A1 | 5/2007 | Fang et al. |
| 2007/0134435 A1 | 6/2007 | Ahn et al. |
| 2008/0182403 A1 | 7/2008 | Noori et al. |

OTHER PUBLICATIONS

PCT International Search Report and Written Opinion for International Application No. PCT/US08/51731 dated May 21, 2008.
Prosecution History for U.S. Appl. No. 12/017,930 on Aug. 20, 2009.

* cited by examiner

METHODS AND APPARATUS OF CREATING AIRGAP IN DIELECTRIC LAYERS FOR THE REDUCTION OF RC DELAY

BACKGROUND OF THE INVENTION

1. Field of the Invention

Embodiments of the present invention generally relate to the fabrication of integrated circuits. More particularly, embodiments of the present invention relate to methods for forming multilevel interconnect structures that include dielectric materials having low dielectric constants.

2. Description of the Related Art

Integrated circuit geometries have dramatically decreased in size since such devices were first introduced several decades ago. Since then, integrated circuits have generally followed the two year/half-size rule (often called Moore's Law), which means that the number of devices on a chip doubles every two years. Today's fabrication facilities are routinely producing devices having 0.1 µm feature sizes, and tomorrow's facilities soon will be producing devices having even smaller feature sizes.

The continued reduction in device geometries has generated a demand for films having low dielectric constant (k) values because the capacitive coupling between adjacent metal lines must be reduced to further reduce the size of devices on integrated circuits. For example, the scaling of CMOS (complementary field-effect transistor) device requires a continuous reduction to the RC (resistive capacitive) delay in the BEOL (Back-End-Of-the-Line) interconnects. To meet this requirement the dielectric constant (k) of the insulating layers used in the BEOL must be further reduced.

Over the last 10-15 years, the semiconductor industry went through many cycles in reducing the dielectric constant of the insulating layers, from using pure silicon dioxide ($SiO_2$) with k=4.2 to the present day of porous carbon doped silicon oxide film, which comprises silicon, carbon, oxygen and hydrogen (commonly referred as SiCOH), with k=2.4. Conventional techniques generally use two methods to reduce k: (1) adding carbon to the $SiO_2$ matrix and (2) adding porosity. However, these methods of reducing k result in lower mechanical properties compared to that of $SiO_2$. These low mechanical properties, such as low modulus, and low hardness, made it difficult to integrate such films with metal lines, for example copper lines, in the dual damascene flow, which is generally used in forming BEOL interconnects. Additionally, future technologies (32 nm node and beyond) will require higher porosity in the SiCOH films. However, the loss of mechanical properties with higher porosity would indicate a lower limit of k~2.0 for this type of films.

Therefore, in view of the continuing decrease in integrated circuit feature sizes and existing problems in the conventional methods, there remains a need for a method of forming dielectric layers having dielectric constants lower than 2.0

SUMMARY OF THE INVENTION

The present invention generally provides methods for forming air gaps in a dielectric around conductive lines in the interconnect materials.

One embodiment provides a method for forming a semiconductor structure comprising depositing a first dielectric layer on a substrate, forming trenches in the first dielectric layer, filling the trenches with a conductive material, planarizing the conductive material to expose the first dielectric layer, depositing a dielectric barrier film on the conductive material and exposed first dielectric layer, depositing a hard mask layer over the dielectric barrier film, forming a pattern in the dielectric barrier film and the hard mask layer to expose selected regions of the substrate, oxidizing at least a portion of the first dielectric layer in the selected region of the substrate, removing oxidized portion of the first dielectric layer to form reversed trenches around the conductive material, and forming air gaps in the reversed trenches while depositing a second dielectric material in the reversed trenches.

In another embodiment, a porous dielectric material is used to form the trenches and an electron beam treatment is used to oxidize the porous dielectric material.

Yet another embodiment provides a method for forming a dielectric structure having air gaps comprising depositing a first dielectric layer on a substrate, depositing a second dielectric layer on the first dielectric layer, forming trench-via structures in the first and second dielectric layer, wherein vias are formed in the first dielectric layer and trenches are formed in the second dielectric layer, filling the trench-via structures with a conductive material, planarizing the conductive material to expose the second dielectric layer, depositing a dielectric barrier film on the conductive material and exposed second dielectric layer, forming a pattern in the dielectric barrier film and the hard mask layer to expose selected regions of the substrate, removing the second dielectric layer in the selected regions of the substrate to form reversed trenches around the conductive material filled in the trenches, and forming air gaps in the reversed trenches while depositing a dielectric material in the reversed trenches.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention provide method for forming air gaps between conductive lines to reduce the dielectric constant k and to reduce RC delay in BEOL interconnects.

Embodiments of the present invention provide methods for forming air gaps in a trench level during fabrication of interconnects. The methods comprise forming conductive lines in a porous low k dielectric material, then removing portions of the porous low k dielectric material to create trenches around the conductive lines, and forming air gaps in the trenches around the conductive lines while depositing a non-uniform dielectric material therein. Depending on the fraction of air gaps in the dielectric material, the dielectric constant of the dielectric material may be reduced by about 25% to about 50%. The methods of the present invention may extend utility of porous low k dielectric material to fabricating devices with critical dimension of 22 nm and beyond. The methods may be applied to any trench level and are economical to perform because steps of forming air gaps are easily incorporated in to the flow of damascene process.

Figure 1:
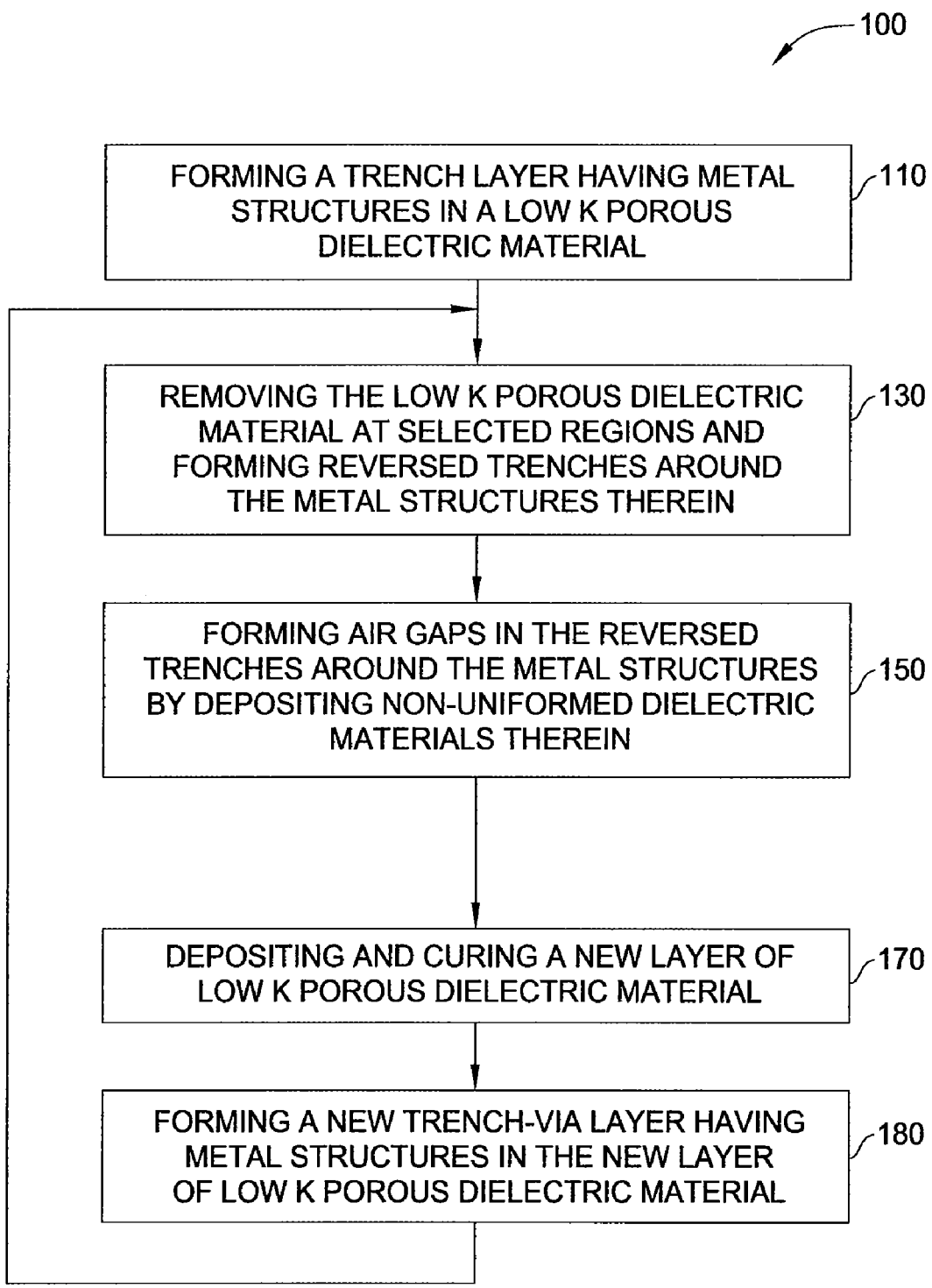
FIG. 1 is a flow chart showing a method for forming air gaps in interconnect in accordance with one embodiment of the present invention.

FIG. 1 is a flow chart showing a method 100 for forming air gaps in interconnect in accordance with one embodiment of the present invention. BEOL interconnect generally includes multiple levels of interconnect structures, typically including alternate trench layers and via layers of conductive materials and dielectrics. A trench layer generally refers to a dielectric film having conductive lines formed therein. A via layer is a layer of dielectrics having small metal vias that provide electrical pathways from one trench layer to another trench layer. The method 100 may be applied in any level of the interconnects.

In step 110 of the method 100, a trench layer having metal structures in a low k porous dielectric material is formed. The trench layer may be formed by itself, for example above a contact layer of devices formed in a semiconductor substrate. In other cases, the trench layer may be formed along with a via layer using any suitable process sequences, for example commonly used damascene process. The trench layer is generally formed from a low k dielectric base which is removable for subsequent air gap formation. In one embodiment, the via layer is also formed in the low k dielectric layer, as illustrated in a process sequence 110a shown in FIG. 2A. In another embodiment, the via layer is formed in a different dielectric material, as illustrated in a process sequence 110b shown in FIG. 2B.

After the formation of the trench layer, selected portions of the low k porous dielectric may be removed so that reversed trenches are formed around the metal structures in the trench layer, as shown in step 130. In one embodiment, the porous low k dielectric material may be removed by oxidizing controlled thickness of the porous low k dielectric followed by a wet etching step, as shown in a process sequence 130a of FIG. 3A. In another embodiment, when the trench layer and the via layer underneath are formed in different dielectric materials, selected regions of the low k porous material in the dielectric layer may be removed by a masked etching process, as illustrated in a process sequence 130b shown in FIG. 3B.

After removing the selected portion of the porous low k dielectric material in the trench layer, air gaps may be formed in the reversed trenches by deposition a non-conformal layer of a dielectric material, as shown in step 150 of FIG. 1. In one embodiment, the air gaps may be formed by depositing a non-conformal layer of dielectric barrier, as shown in a process sequence 150a of FIG. 4A. In another embodiment, the air gaps may be formed while filling the reversed trenches with an interlayer dielectric material, as shown in a process sequence 150b of FIG. 4B.

Upon the formation of the air gaps, fabrication of the trench layer is completed, a new layer of low k porous dielectric material may be deposited and cured directly or indirectly on the trench layer, as shown in step 170 of FIG. 1.

In step 180, a new trench-via layer having metal structures may be formed in the new layer of low k porous dielectric material. Air gaps may be formed in the new low k porous dielectric material using steps 130 and 150 if so desired.

Air gaps may be formed in dielectric layers using the method 100. Different embodiments are available using combinations of different process sequences for steps 110, 130, 150. Four exemplary embodiments are described below.

Embodiment 1

FIGS. 5A-5G schematically illustrate formation of a substrate stack 200a having air gaps in accordance with one embodiment of the present invention. The substrate stack 200a are formed using the process sequence 110a of FIG. 2A, followed by the process sequence 130a of FIG. 3A, followed by the process sequence 150a of FIG. 4A.

Figure 2A:
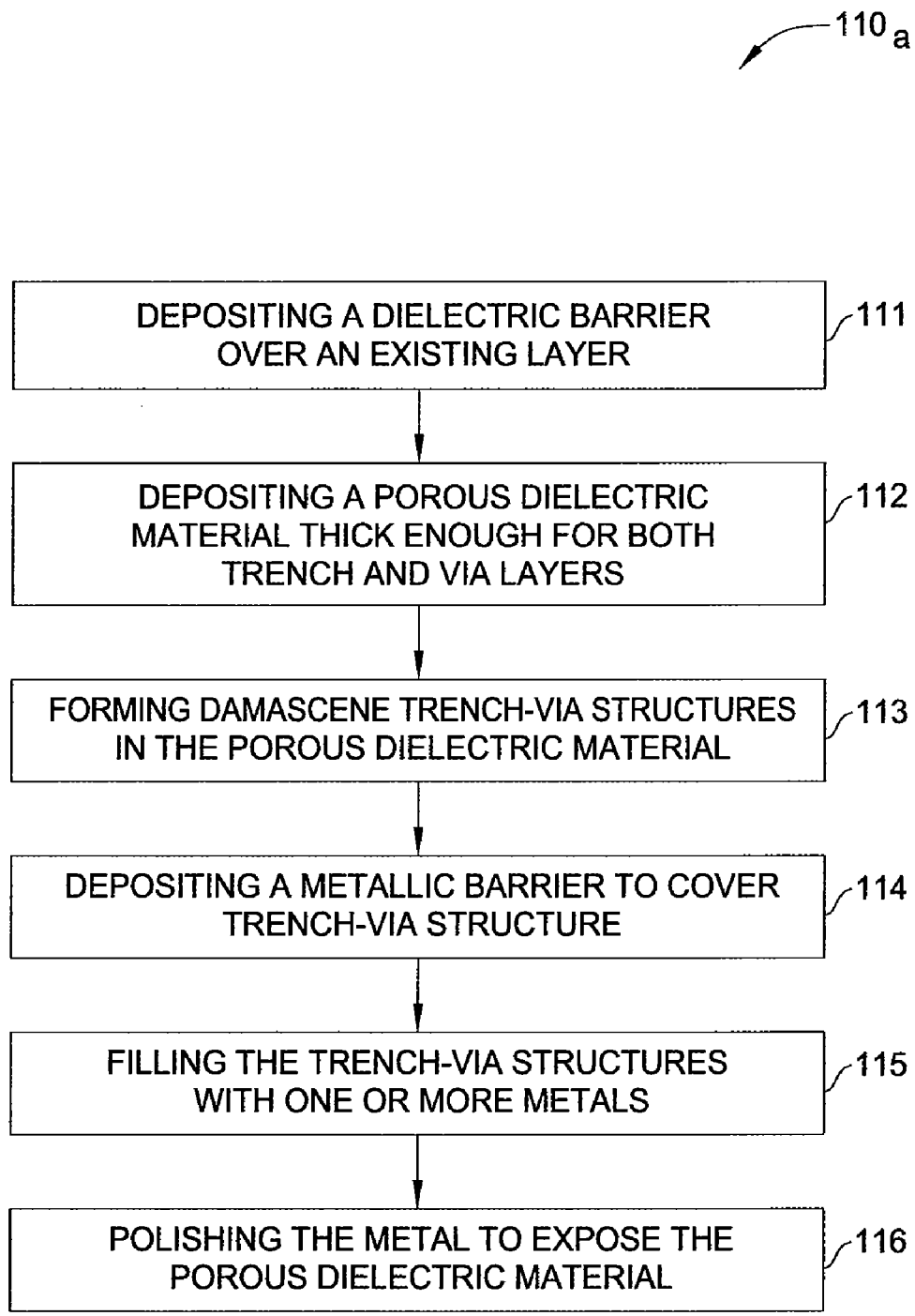
FIG. 2A is a flow chart showing a process sequence for forming trench-via structures in accordance with one embodiment of the present invention.
Figure 5A:
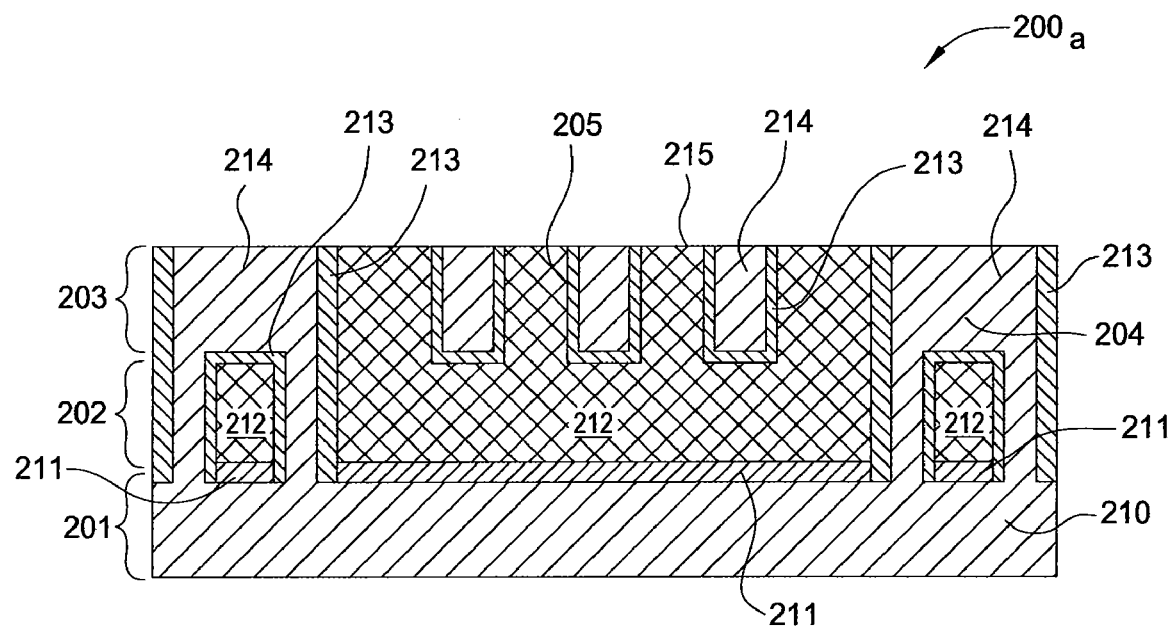
FIGS. 5A-5G schematically illustrate formation of a substrate stack having air gaps in accordance with one embodiment of the present invention.

Referring to FIG. 5A, a via layer 202 and a trench layer 203 are formed on a preexisting layer 201, which includes a conductive line 210. FIG. 2A illustrates a step 110 that may be used to form the via layer 202 and the trench layer 203 as shown.

In step 111 of the process sequence 110a, a dielectric barrier film 211 is deposited all over the preexisting layer 201. The dielectric barrier film 211 is configured to prevent diffusion of conductive materials, for example metals for the conductive line 210, into a subsequent dielectric layer. The dielectric barrier film 211 generally comprises a barrier dielectric material, such as silicon nitride, silicon oxycarbide, amorphous hydrogenated silicon carbide, or nitrogen doped silicon carbide (BLOk™).

In step 112, a porous low k dielectric material 212 is formed over the dielectric barrier film 211. The porous low k dielectric material 212 has a thickness sufficient to form both the via layer 202 and the trench layer 203. Forming the porous low k dielectric material 212 generally comprises depositing a silicon/oxygen containing material that further contains labile organic group, and curing the silicon/oxygen containing material to form microscopic gas pockets that uniformly dispersed in the layer. Curing the porous low k material 212t may include electron beam (e-beam) treatments, ultraviolet (UV) treatments, thermal annealing treatments (in the absence of an electron beam and/or UV treatment), and combinations thereof.

The porous low k dielectric material 212 generally has a dielectric constant lower than 2.5. Detailed description of exemplary methods for forming the porous low k dielectric material 212 may be found in the United States Patent Application Publication No. 2005/0233591, entitled "Techniques Promoting Adhesion of Porous Low K Film to Underlying Barrier Layer", which is incorporated herein by reference.

In step 113, trench-via structures are formed in the porous low k dielectric material 212. The trench-via structures comprises trenches 205 formed above vias 204 and may be formed using damascene methods. Exemplary methods for forming the trench-via structures in one dielectric layer may be found in the U.S. patent application Ser. No. 6,753,258, entitled "Integration Scheme for Dual Damascene Structure", which is incorporated herein by reference.

In step 114, a metallic diffusion barrier 213 is lined on the surface of the trench-via structure. The metallic diffusion barrier 213 is configured to prevent diffusion between metal lines subsequently deposited in the trenches and the dielectric structures nearby. The metallic diffusion barrier 213 may comprise tantalum (Ta) and/or tantalum nitride (TaN).

In step 115, the trench-via structures is filled with conductive lines 214 comprising one or more metals. In one embodiment, a sputtering step may be performed to remove the metallic diffusion barrier 213 from entire or portions of bottom walls of the trench-via structures, so that the conductive lines 214 may be in direct contact with the conductive lines 210 of the preexisting layer 201. Depositing the conductive lines 214 may comprise forming a conductive seed layer and depositing a metal on the conductive seed layer. The conductive lines 214 may comprise copper (Cu), aluminum (Al), or any suitable material with desirable electrical conductivity.

In step 116, a chemical mechanical polishing (CMP) process is performed on the conductive lines 214, and the metallic diffusion barrier 213 so that the porous low k dielectric 212 is exposed on a top surface 215 of the substrate stack 200a, as shown in FIG. 5A.

Upon the formation the via layer 202 and the trench layer 203, portions of the porous low k dielectric 212 in the trench layer 203 may be removed so that air gaps may be formed between the conductive lines 214.

Figure 3A:
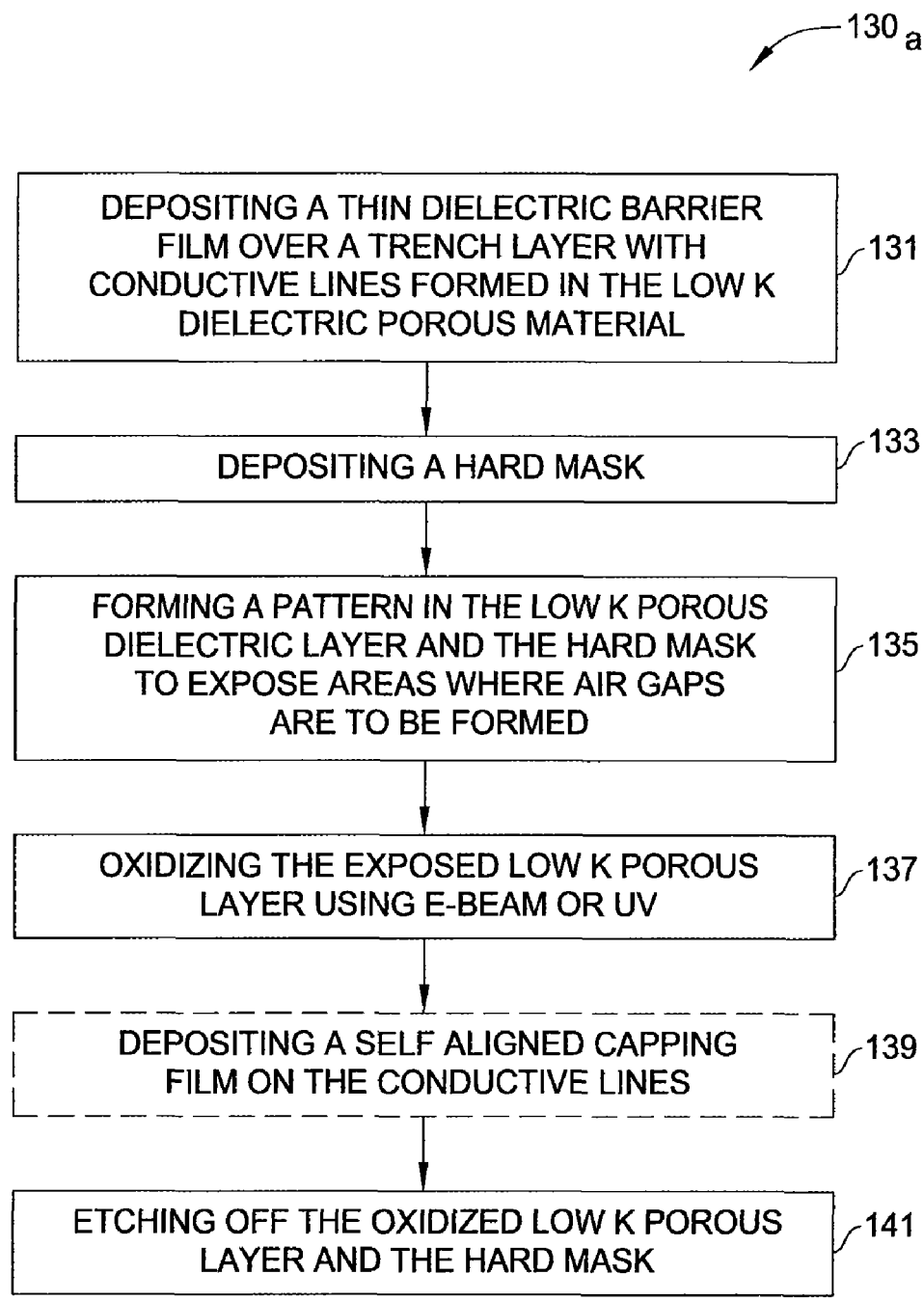
FIG. 3A is a flow chart showing a process sequence for removing portions of dielectric material in accordance with one embodiment of the present invention.
Figure 3B:
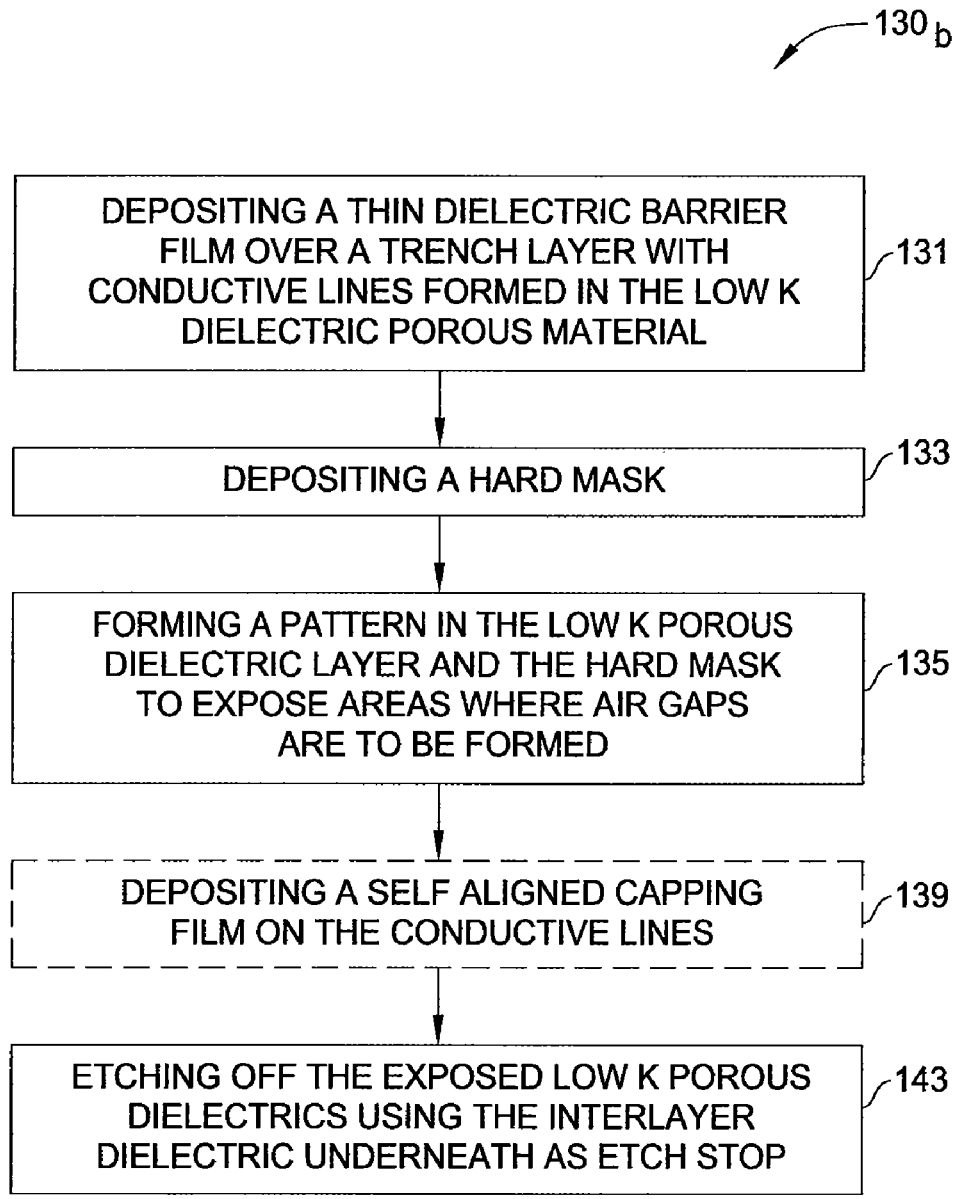
FIG. 3B is a flow chart showing a process sequence for removing portions of dielectric material in accordance with another embodiment of the present invention.

The process sequence 130a shown in FIG. 3A may be used to remove the porous low k dielectric 212.

Figure 5B:
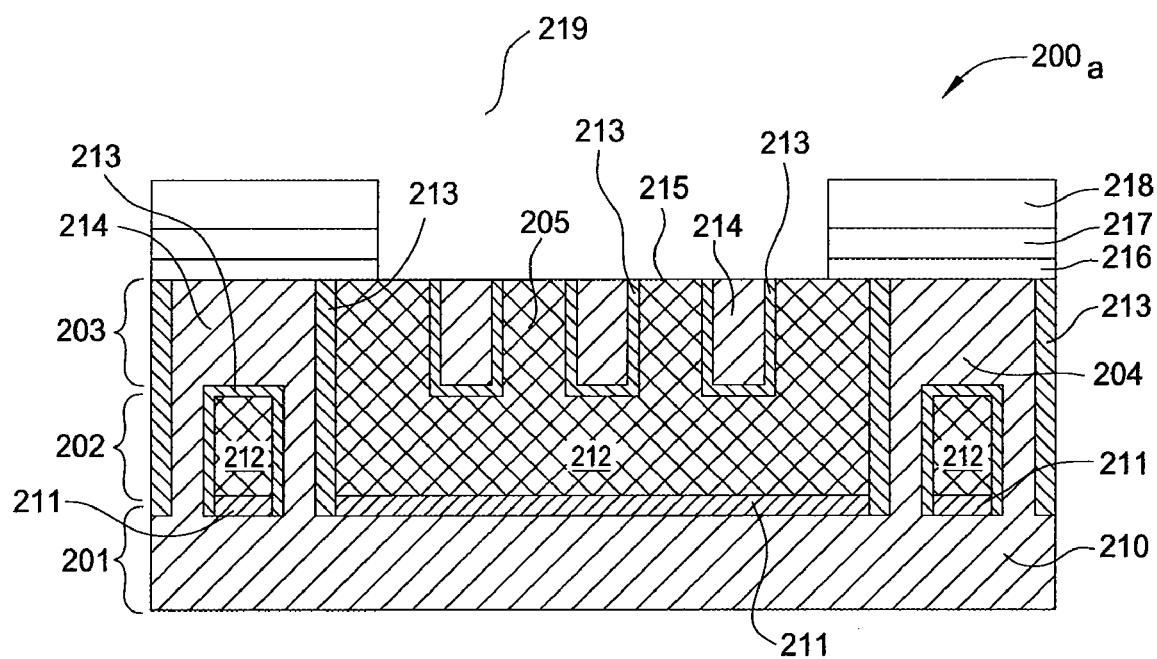

In step 131, a dense dielectric barrier film 216 is deposited over the top surface 215, as shown in FIG. 5B. The dense dielectric barrier film 216 is configured to prevent diffusion of metals, such as copper, in the conductive lines 214, and migration of wet etching chemistry to the conductive lines 214 in the subsequent process. The dense dielectric barrier 216 may comprises a thin low k dielectric barrier film, such as silicon carbide (SiC), silicon carbide nitride (SiCN), boron nitride (BN), silicon boron nitride (SiBN), silicon boron carbide nitride (SiBCN), or combinations thereof.

In step 133, a hard mask layer 217 is deposited over the dense dielectric barrier film 216, as shown in FIG. 5B. The hard mask layer 217 is configured to provide patterning to the substrate stack in a thermal process. The hard mask layer 217 may comprises silicon oxide.

In step 135, a pattern 219 is formed in the hard mask layer 217 and the dense dielectric barrier 216 using a photoresist 218, as shown in FIG. 5B. The pattern 219 exposes only portions of the substrate where air gaps are desired. It is desirable to form air gaps in areas densely packed with conductive lines. In one embodiment, air gaps may be formed in areas where the distance between neighboring conductive lines 214 is between about 100 nm to about 200 nm.

Figure 5C:
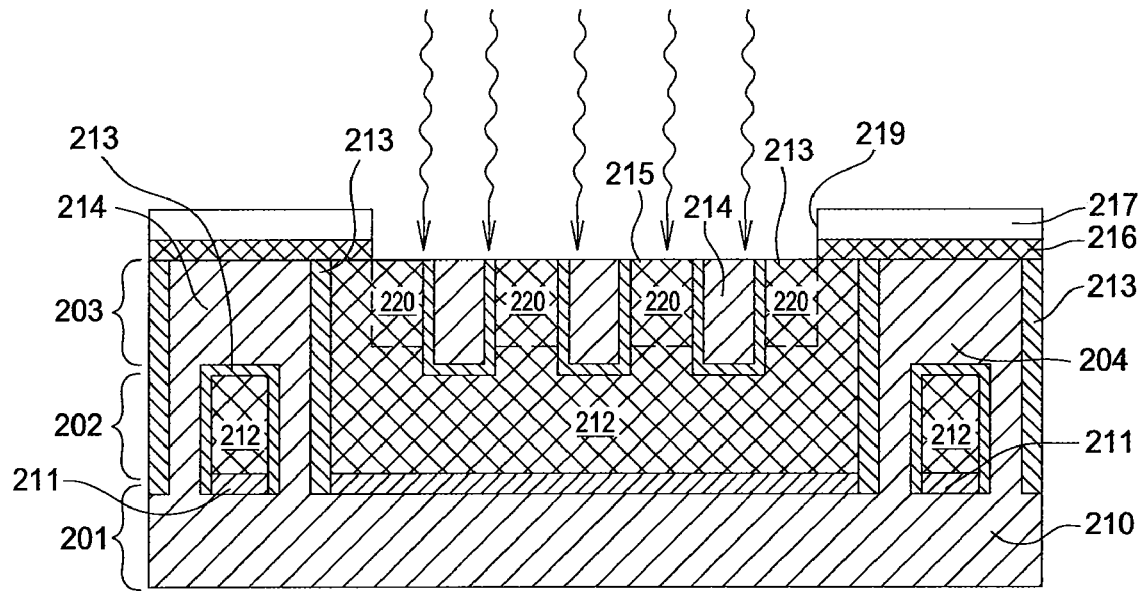

In step 137, an oxidizing process is performed to the porous low k dielectric material 212 exposed by the hard mask layer 217, as shown in FIG. 5C. In one embodiment, the oxidizing process may be performed by dispensing energy to the porous low k dielectric material 212 using an electron beam (E-beam) in an ambient of inert gas and/or oxygen. E-beam treated porous dielectric 220 has increased wet etching rate and may be selectively removed. Experiments have shown that E-beam treatment in accordance with embodiments of the present invention may increase the wet etching rate (WER) of the low k porous dielectric material 212 by about 100 times. For example, the etching rate of a porous low k dielectric material after UV curing (which forms nanosized air bubbles in the dielectric) is about 0.219 Å/min in a 100:1 dilute hydrogen fluoride (DHF) solution. While the same material after an E-beam treatment may have a wet etch rate of about 30 Å/min in a 100:1 DHF solution. Thus, the porous low k dielectric material 212 may be selectively removed using wet etching process after exposing selected portion to the E-beam treatment.

An E-beam treatment apparatus generally includes a vacuum chamber, a large-area cathode, a target or substrate to be treated located in field-free region, and an anode placed between the target and the cathode at a distance from the cathode that is less than the mean free path length of electrons emitted therefrom. An E-beam apparatus further comprises a high voltage power supply connected to the cathode and a low voltage power supply connected to the anode.

During processing, gas in a space between the cathode and the target may become ionized to initiate electron emission. This occurs as a result of naturally occurring gamma rays, or emission can instead be initiated artificially inside the chamber by a high voltage spark gap. Once this initial ionization takes place, positive ions are attracted to the anode by a slightly negative voltage being applied to the anode. These positive ions pass into an accelerating field region between the cathode and the anode, and are accelerated towards the cathode surface as a result of the high voltage applied to the cathode. Upon striking the surface of the cathode, these high energy ions produce secondary electrons that are accelerated back toward the anode. Some of these electrons (which are now traveling mostly perpendicular to the cathode surface) strike the anode, but many pass through the anode and continue on to the target, thus, performing an E-beam treatment to the substrate. Detailed description on apparatus and method for an E-beam treatment may be found in U.S. Pat. No. 6,936,551, entitled "Method and Apparatus for E-beam Treatment Used to Fabricate Integrated Circuit Devices", which is incorporated herein by reference. The E-beam treatment may be performed in an EBk™ electron beam chamber available from Applied Materials, Inc. of Santa Clara, Calif.

The E-beam treatment may be performed in an inert ambient, such as argon. In another embodiment, the E-beam treatment may also be performed in an oxygen environment, for example in an ambient of pure oxygen or mixture of inert gas and oxygen.

One embodiment of the present invention comprises controlling the depth of the E-beam treated porous dielectric 220. The depth of the E-beam treated porous dielectric 220 is determined by the depth to which impinging electrons penetrate the dielectric layer before being absorbed. The depth generally depends on many factors (including the particular material which is being treated). One of the most critical of which is the energy of the electron beam as determined by the accelerating voltage. In one embodiment of the present invention, the depth of the E-beam treatment may be controlled using the following equation:

$$\text{Depth} = \frac{0.046(V_{acc})^a}{\rho} \quad (1)$$

wherein Depth is treatment depth in Angstroms, $V_{acc}$ is voltage applied to the cathode in keV, a is a constant, and $\rho$ is density of the film being processed in $gm/cm^3$. In one embodiment, for the porous low k dielectric material 212 having a dielectric constant k=2.35 and a density of $\rho$=1.08 $gm/cm^3$, the depth of treatment may be calculated using a=1.80.

Alternatively, the oxidizing process may be performed by exposing the selected areas to ultra violet (UV) energy in an ambient with inert gas and/or oxygen gas.

Figure 5D:
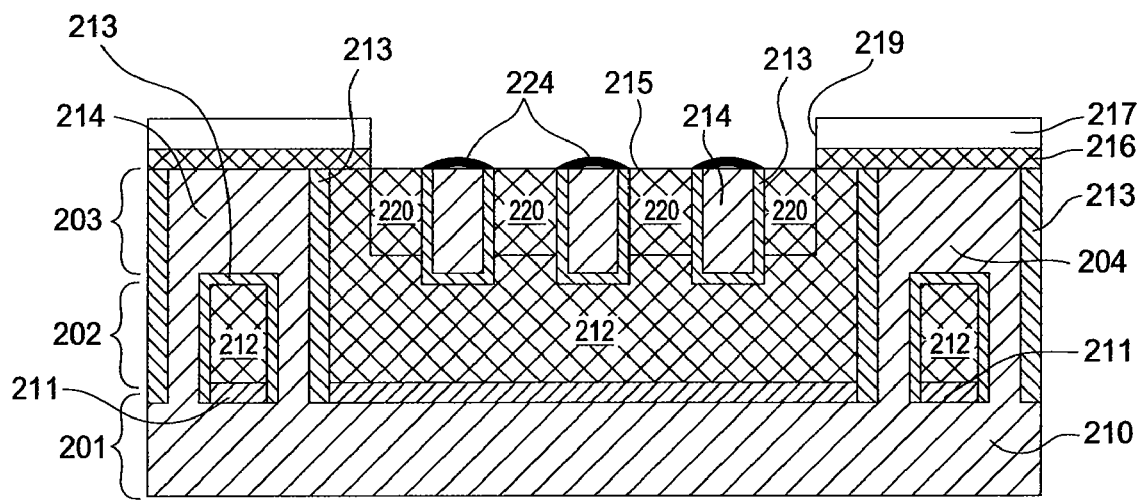

In an optional step 139, a self-aligned capping layer 221 is formed on the conductive lines 214, as shown in FIG. 5D. The self-aligned capping layer 221 may be formed using electroless deposition and formed only on the exposed surface of the conductive lines 214. The self-aligned capping layer 221 is configured to be a barrier to protect the conductive lines 214 from wet etching chemistry used in air gap formation and to prevent diffusion of species across an upper surface of the conductive lines 210. The self-aligned capping layer 221 may prevent diffusion of both copper and oxygen. For the conductive lines 214 comprise copper, the self-aligned capping layer 221 may comprise a variety of compositions containing cobalt (Co), tungsten (W) or molybdenum (Mo), phosphorus (P), boron (B), rhenium (Re), and combinations thereof. Detailed descriptions for forming the self-aligned capping layer 221 may be found in the United States Patent Publication No. 2007/0099417, entitled "Adhesion and Minimizing Oxidation on Electroless Co Alloy Films for Integration with Low k Inter-Metal Dielectric and Etch Stop", which are incorporated herein by reference.

Figure 5E:
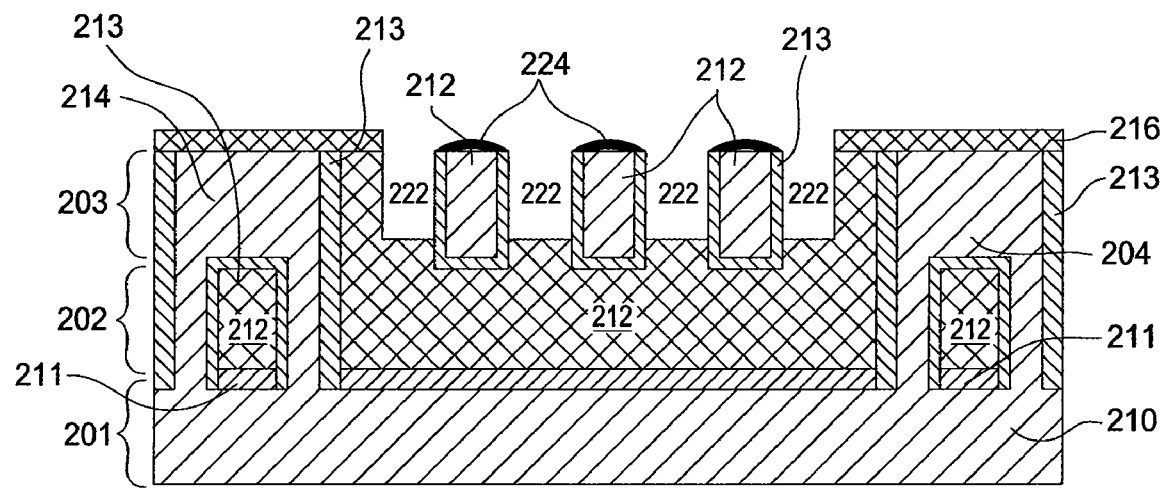

In step 141, the E-beam treated porous dielectric 220 and the hard mask layer 217 are removed using a wet etching chemistry, as shown in FIG. 5E. The wet etching chemistry may be a DHF solution. Other wet etching chemicals, such as buffered hydrogen fluoride (BHF, $NH_4F+HF+H_2O$), may also be used. Exemplary etching methods may be found in U.S. Pat. No. 6,936,183, entitled "Etch Process for Etching Microstructures", which is herein incorporated by reference. After the removal of the E-beam treated porous dielectric 220, reversed trenches 222 are formed between the conductive lines 214.

Example for Curing and Etching

Copper conductive lines are formed in a nitrogen doped silicon dioxide layer. The copper conductive lines are deposited in trenches with depth of about 257 nm. Distances between neighboring conductive lines are about 88 nm. After CMP and masking, the nitrogen doped silicon dioxide layer is cured by electron beam of 150 Dose. During electron beam curing, argon is flown to the processing chamber at a flow rate of about 50 sccm. The cured structure is the subjected to etching solution of diluted HF with a water/HF ratio of 100:1. The etch depth is about 150 nm after 1 minute wet etching, about 180 nm after 2 minute wet etching, and about 190 nm about 3 minute wet etching.

After formation of the reversed trenches 222, one or more dielectric material having air gaps may be filled in the reversed trenches 222. The process sequence 150a shown in FIG. 4A may be used to fill the reversed trenches 222 and to form air gaps.

In step 151, the reversed trenches 222 are filled with a dielectric barrier 223. Air gaps 224 are uniformly formed and sealed in the reversed trenches 222 during the deposition of the dielectric barrier 223. The air gaps 224 are formed in the reversed trenches 222 due to the non-conformality of the deposition process, wherein a deposition rate on the side walls is relatively slow compared to the deposition rate near the entrance of the reversed trenches 222 "pinching off" the entrance before the reversed trenches 222 are filled and forming air gaps 224 therein.

In one embodiment, the dielectric barrier 223 is the same or similar to the dielectric barrier 216. The dielectric barrier 223 generally covers the sidewalls of the reversed trenches 222 prior to pinch off providing barrier against the diffusion of the conductive lines 214.

The dielectric barrier 223 may be deposited using PECVD. The deposition process of the dielectric barrier 223 is controlled so that bottoms and sidewalls of the reversed trenches 222 are covered prior to the pinch off and the air gaps are uniformly height wise so that the subsequent CMP process does not break the air gaps 224. In one embodiment, the process may be controlled by adjusting chamber pressure, and/or bias power in plasma generation. In another embodiment, the process may be adjusted by adjusting the shape and/or aspect ratio of the reversed trenches to control the location of the air gaps 224.

Figure 10:
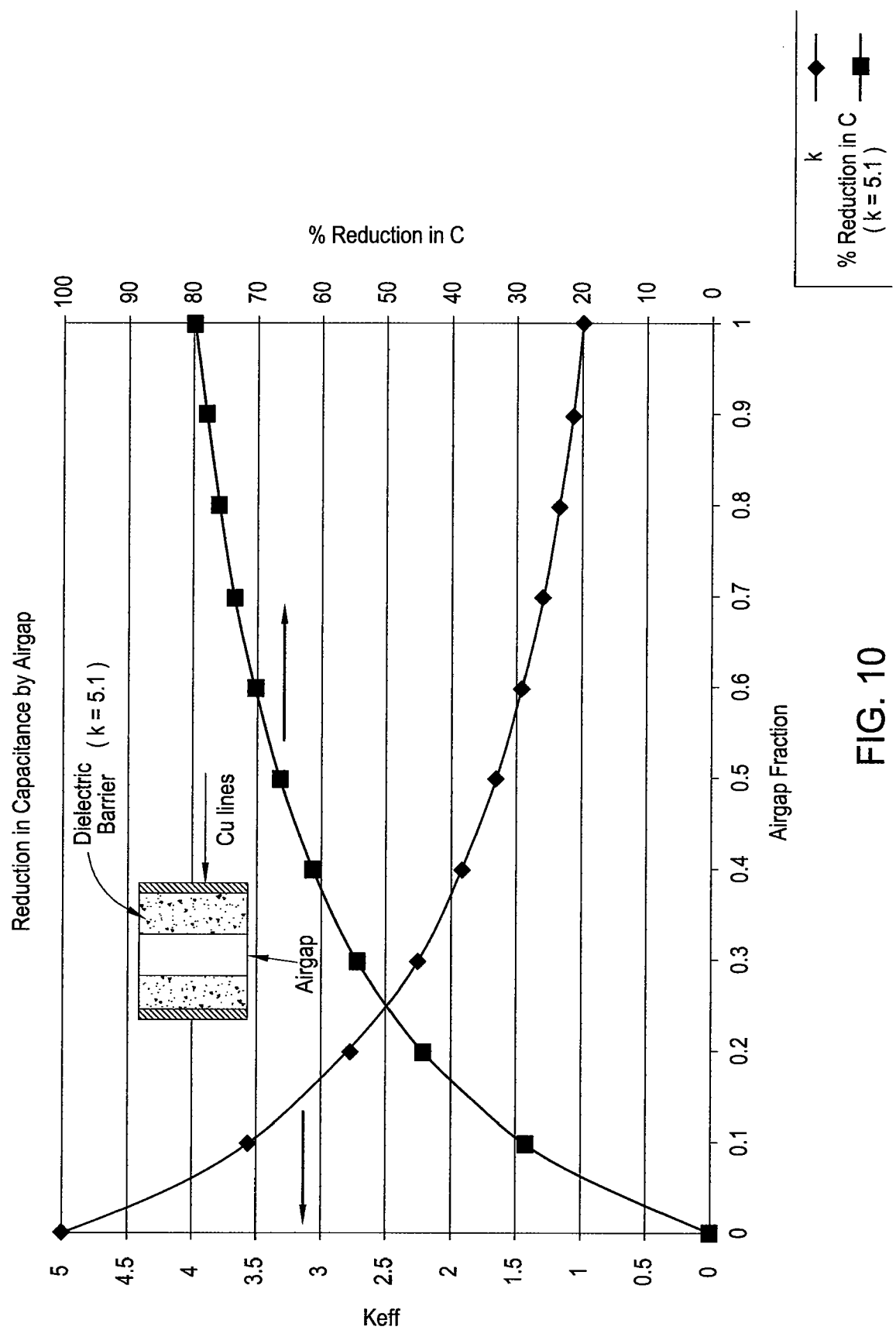
FIG. 10 schematically illustrates relationships of air gap fraction with effective dielectric constant and ratio of capacitance reduction for a barrier dielectric with k=5.1.

The dielectric barrier 223 may comprise a dense low k, k=5.1, barrier dielectric. The presence of the air gaps 224 in the dielectric barrier 223 reduces the effective dielectric constant of the dielectric material between the conductive lines 214, thus reducing the capacitance between the conductive lines 214. FIG. 10 schematically illustrates relationships of air gap fraction with effective dielectric constant and ratio of capacitance reduction for a barrier dielectric with k=5.1. It is shown, the effective dielectric constant may be reduced to 2 and the capacitance reduced by about 58% by introducing about 38% of air gaps in the dielectric barrier 223 between the conductive lines 214.

Figure 5F:
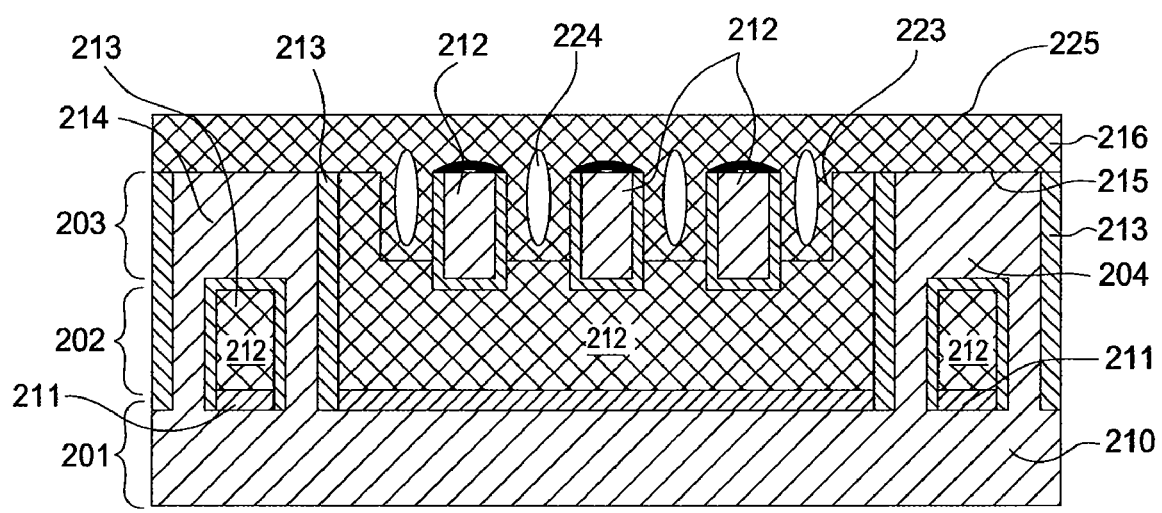

In step 153, a CMP process is performed on the dielectric barrier 223 to remove excessive material and to achieve a planar top surface 225 for subsequent trench and via layers, as shown in FIG. 5F. In one embodiment, the dielectric barrier 223 may be planarized to have a desired thickness above the top surface 215 of the trench layer 203 so that the dielectric barrier 223 provides barrier for subsequent interlayer dielectric against the conductive lines 214 in the trench layer 203. In one embodiment, the planarization may be terminated prior to breaking into the air gaps 224. To avoid increasing thickness of the substrate stack, it is desired to control the height of the air gaps 224.

Figure 5G:
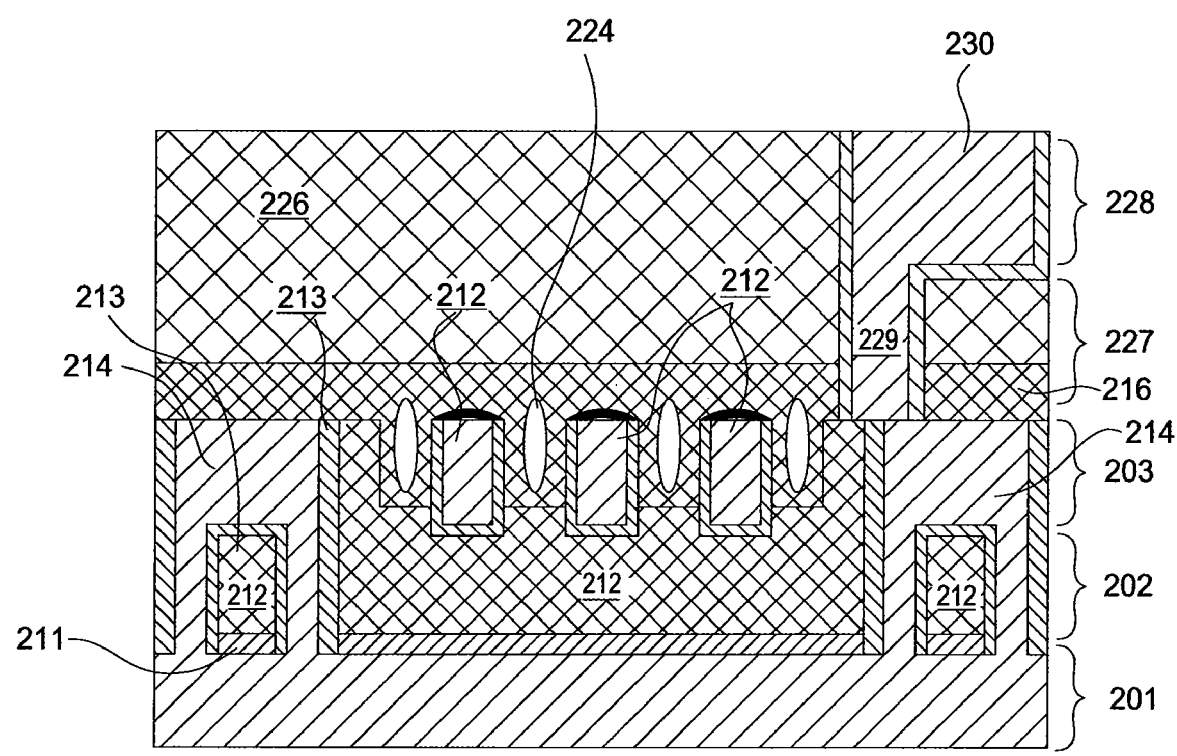

Referring to FIG. 5G, a new interlayer dielectric 226, for example a new porous low k dielectric layer, is deposited on the top surface 225 of the dielectric barrier 223, as described in step 170 of FIG. 1. Via layer 227 and trench layer 228 may be subsequently formed in the new interlayer dielectric 226. Trench 230 and via 229 is then filled with conductive material. A new cycle of air gap formation may be performed on the trench layer 228 if desired.

It should be noted that air gaps generated using methods of the present invention do not have problems with unlanded vias, as shown in FIG. 5G. The via 229 does not completely land on the conductive lines 214 of the trench layer 203. Portions of the via 229 is in contact with the porous low k dielectric material 212. However, contacts between the unlanded portion of the via 229 and the air gaps 224 is avoidable because the air gaps only forms in a selected region.

Embodiment 2

Figure 6A:
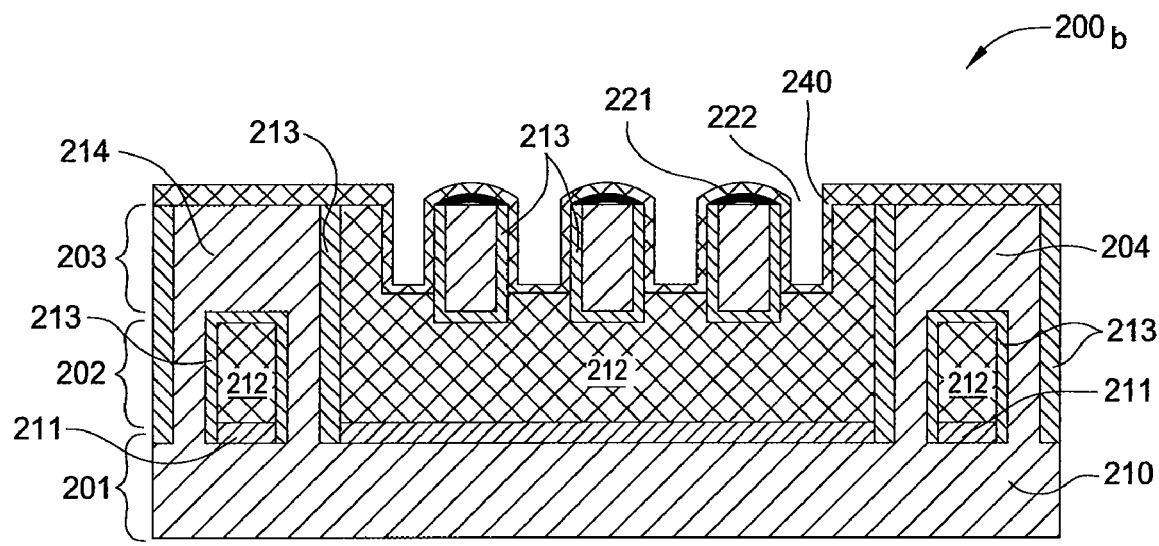
FIGS. 6A-6C schematically illustrate formation of a substrate stack having air gaps in accordance with another embodiment of the present invention.
Figure 6B:
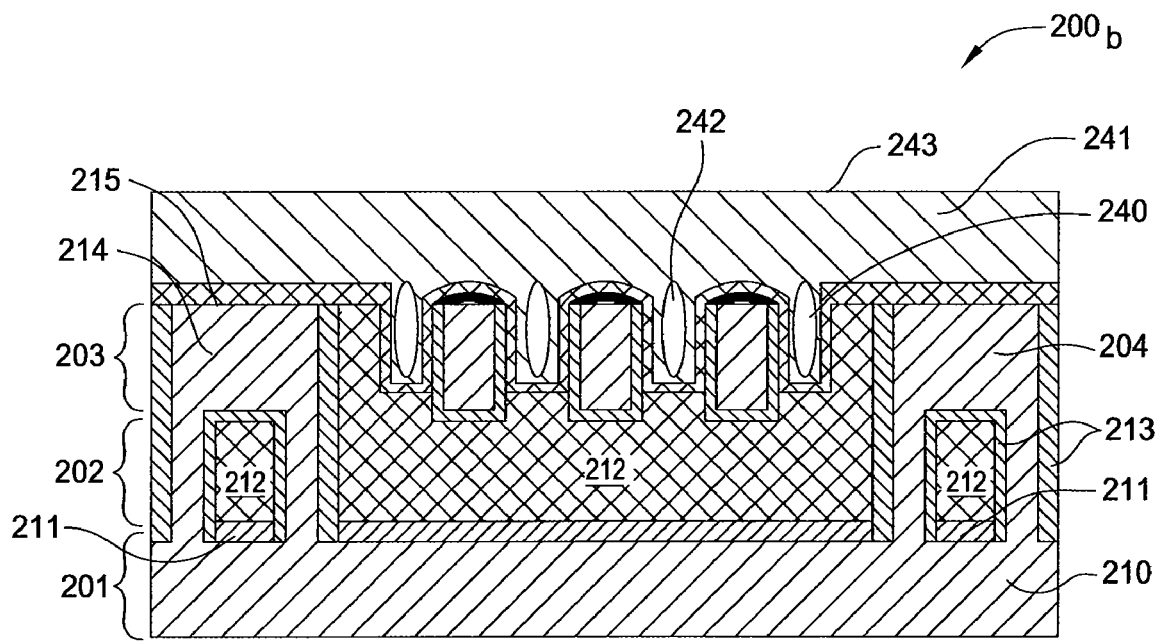
Figure 6C:
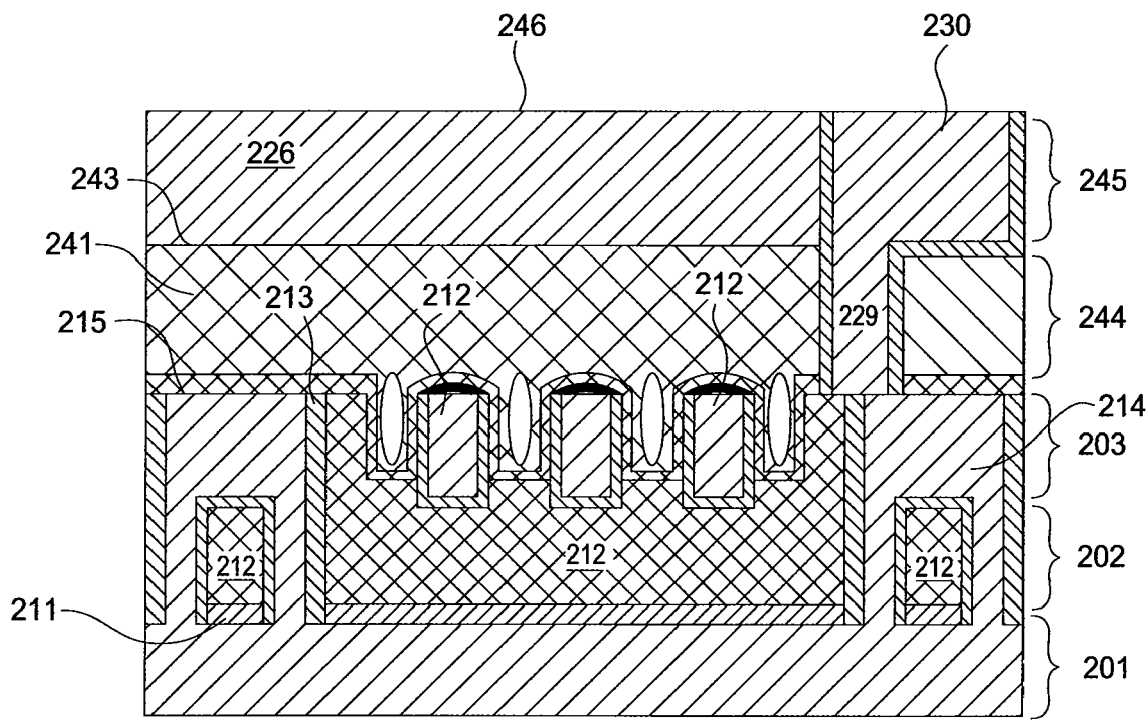

FIGS. 6A-6C schematically illustrate formation of a substrate stack 200b having air gaps in accordance with one embodiment of the present invention. The substrate stack 200b are formed using the process sequence 110a of FIG. 2A, followed by the process sequence 130a of FIG. 3A, followed by the process sequence 150b of FIG. 4B. The process sequence of the substrate stack 200b is similar to that of the substrate stack 200a prior to formation of air gaps and is illustrated in FIGS. 5A-5D.

After formation of the reversed trenches 222, one or more dielectric material having air gaps may be filled in the reversed trenches 222. The process sequence 150b shown in FIG. 4B may be used to fill the reversed trenches 222 and to form air gaps.

In step 155, the reversed trenches 222 are lined with a thin layer of dielectric barrier material 240, as shown in FIG. 6A. In one embodiment, the dielectric barrier material 240 is the same or similar to the dielectric barrier 216. The dielectric barrier material 240 generally covers the sidewalls of the reversed trenches 222 providing barrier against the diffusion of the conductive lines 214 for subsequent dielectric materials.

In step 157, the reversed trenches 222 are filled with an interlayer dielectric material 241, as shown in FIG. 6B. Air gaps 242 are uniformly formed and sealed in the reversed trenches 222 during the deposition of the interlayer dielectric material 241. The air gaps 242 are formed in the reversed trenches 222 due to the non-conformality of the deposition process, wherein a deposition rate on the side walls is relatively slow compared to the deposition rate near the entrance of the reversed trenches 222 "pinching off" the entrance before the reversed trenches 222 are filled and forming air gaps 242 therein.

The interlayer dielectric 241 may be deposited using PECVD. The deposition process of the interlayer dielectric 241 is controlled so that the air gaps 242 are formed from pinching off effect near the entrance of the reversed trenches 222. In one embodiment, the air gaps 242 are uniform height wise so that the subsequent CMP process does not break the air gaps 242. In one embodiment, the process may be controlled by adjusting chamber pressure, and/or bias power in plasma generation. In another embodiment, the process may be adjusted by adjusting the shape and/or aspect ratio of the reversed trenches to control the location of the air gaps 242. A detailed description of formation of the interlayer dielectric 242 may be found in the U.S. Pat. No. 6,054,379, entitled "Method of Depositing a Low K Dielectric with Organo Silane", which is incorporated herein by reference.

Figure 11:
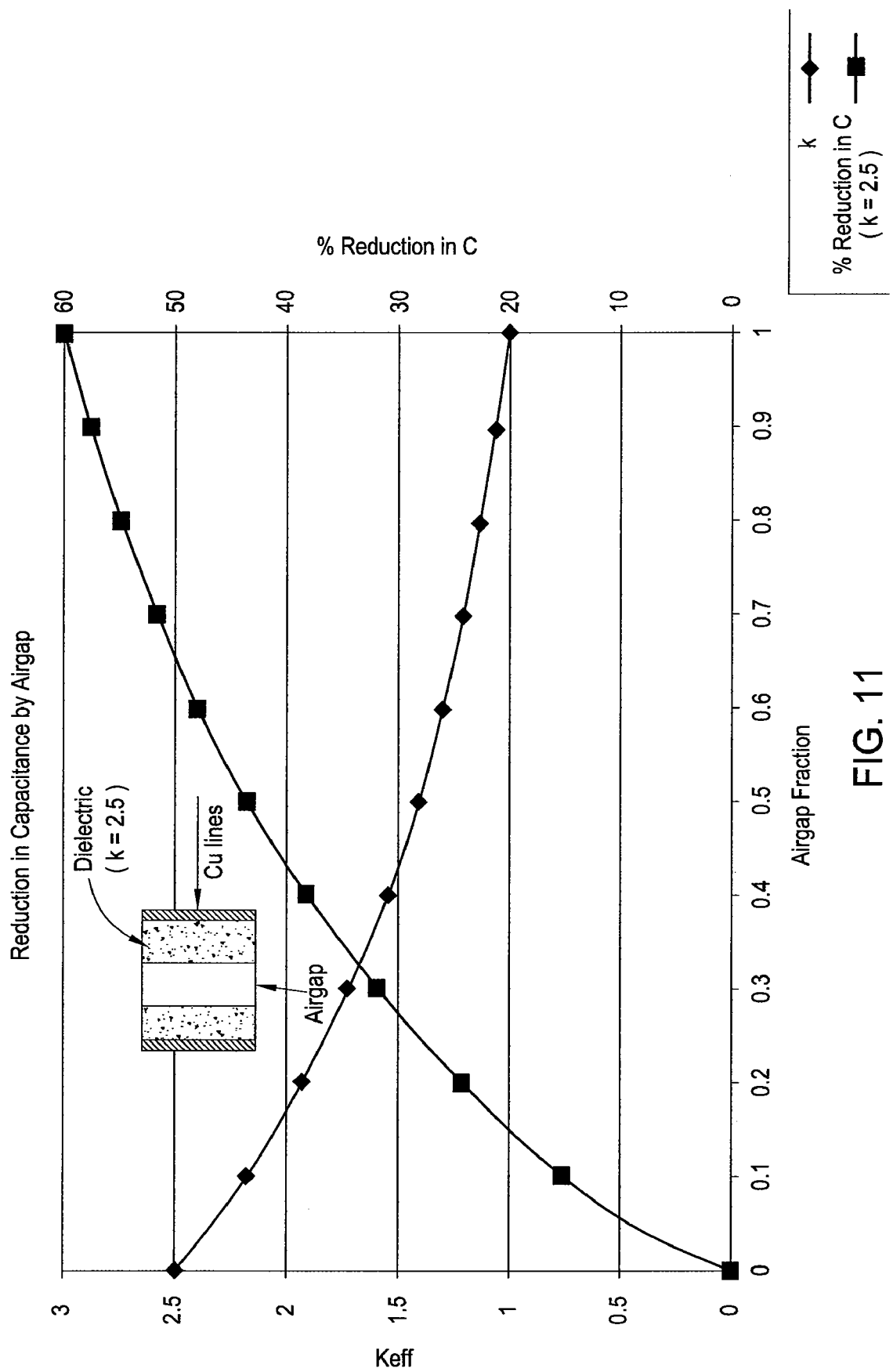
FIG. 11 schematically illustrates relationships of air gap fraction with effective dielectric constant and ratio of capacitance reduction for a barrier dielectric with k=2.5.

The interlayer dielectric material 241 may comprise a low k, k=2.5, dielectric material. The presence of the air gaps 242 in the interlayer dielectric 241 reduces the effective dielectric constant of the dielectric material between the conductive lines 214, thus reducing the capacitance between the conductive lines 214. FIG. 11 schematically illustrates relationships of air gap fraction with effective dielectric constant and ratio of capacitance reduction for an interlayer dielectric with k=2.5. It is shown, the effective dielectric constant may be reduced to k=2 and the capacitance reduced by about 20% by introducing about 17% of air gaps in the interlayer dielectric 241 between the conductive lines 214.

In step 159, a CMP process is performed on the interlayer dielectric 241 to remove excessive material and to achieve a planar top surface 243 for subsequent, as shown in FIG. 6B. In one embodiment, the interlayer dielectric 241 may be planarized to have a desired thickness above the top surface 215 of the trench layer 203 so that a subsequent via layer may be formed in the interlayer dielectric 241. In one embodiment, the planarization may be terminated prior to breaking into the air gaps 242. To avoid increasing thickness of the substrate stack, it is desired to control the height of the air gaps 242. In this embodiment, the top of the air gaps 242 may be at a higher position than the top surface 215 of the trench layer 203, because the interlayer dielectric 214 has a thickness allowance of a via layer.

Referring to FIG. 6C, a new porous low k dielectric layer 246 is deposited on the top surface 243 of the interlayer dielectric 241. A via layer 244 is formed in the interlayer dielectric 241 and a trench layer 245 is formed in the new porous dielectric layer 246. Trench-via structures may then be filled with conductive material. A new cycle of air gap formation may be performed on the trench layer 245 if desired.

Embodiment 3

Figure 7:
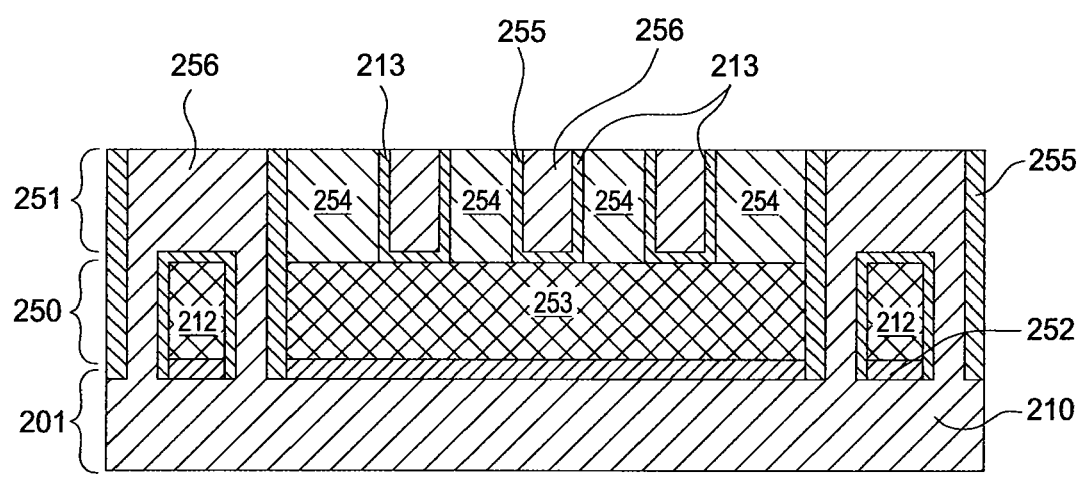
FIG. 7 schematically illustrates a substrate stack having trench via structures formed using the process sequence of FIG. 2B.
Figure 8A:
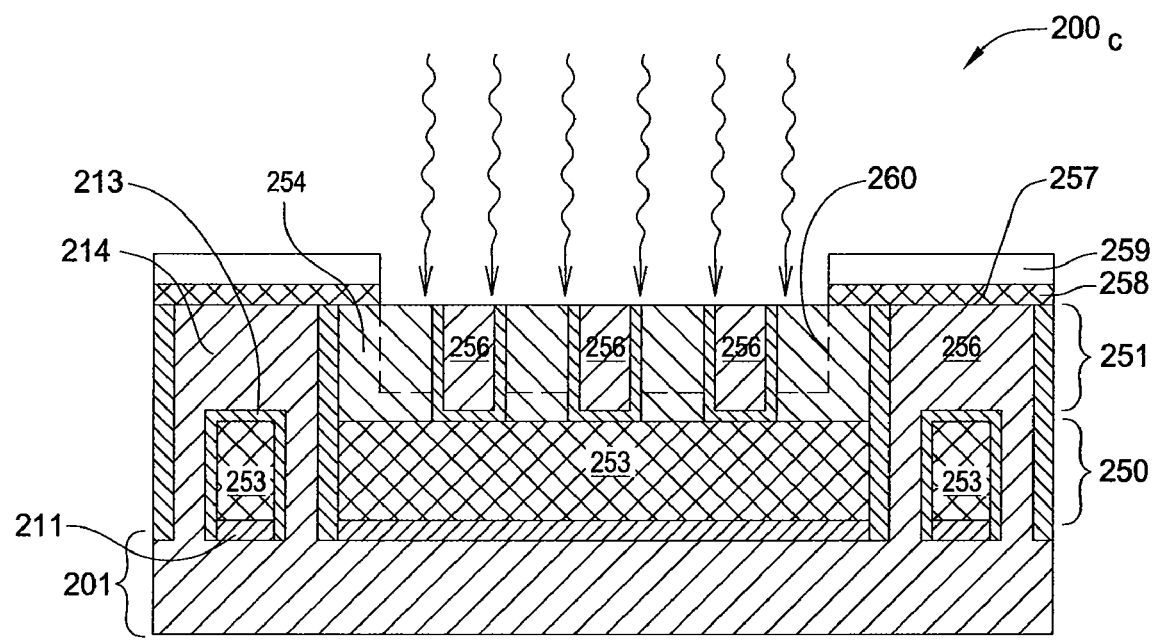
FIGS. 8A-B schematically illustrate formation of a substrate stack having air gaps in accordance with one embodiment of the present invention.
Figure 8B:
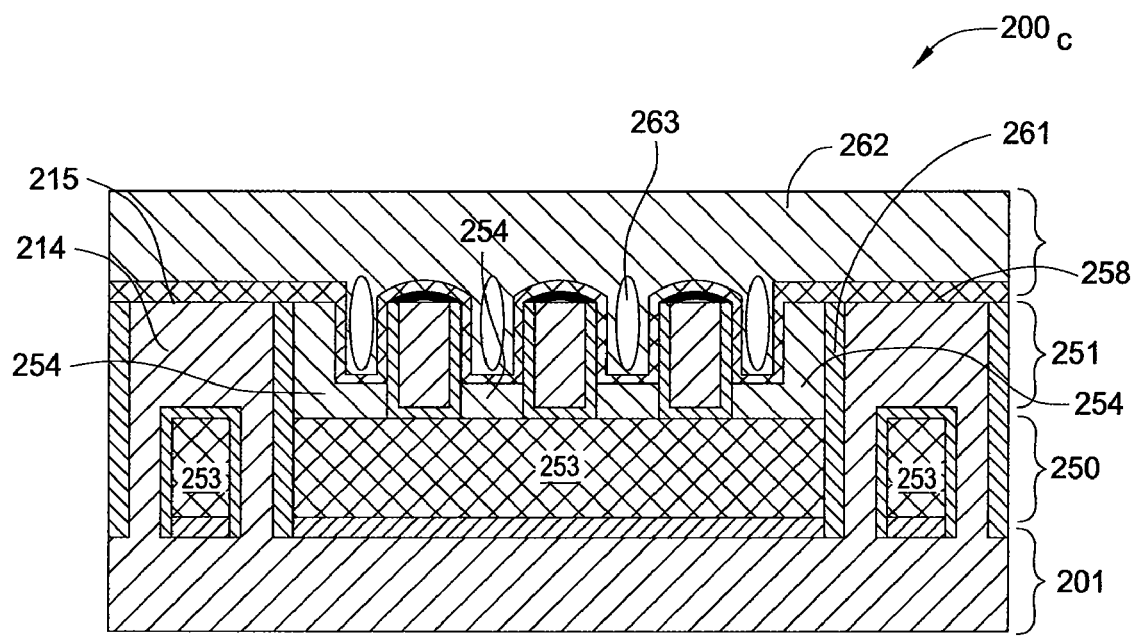

FIG. 7 and FIGS. 8A-8B schematically illustrate formation of a substrate stack 200c having air gaps in accordance with one embodiment of the present invention. The substrate stack 200c are formed using the process sequence 110b of FIG. 2B, followed by the process sequence 130a of FIG. 3A, followed by the process sequence 150b of FIG. 4B.

Figure 2B:
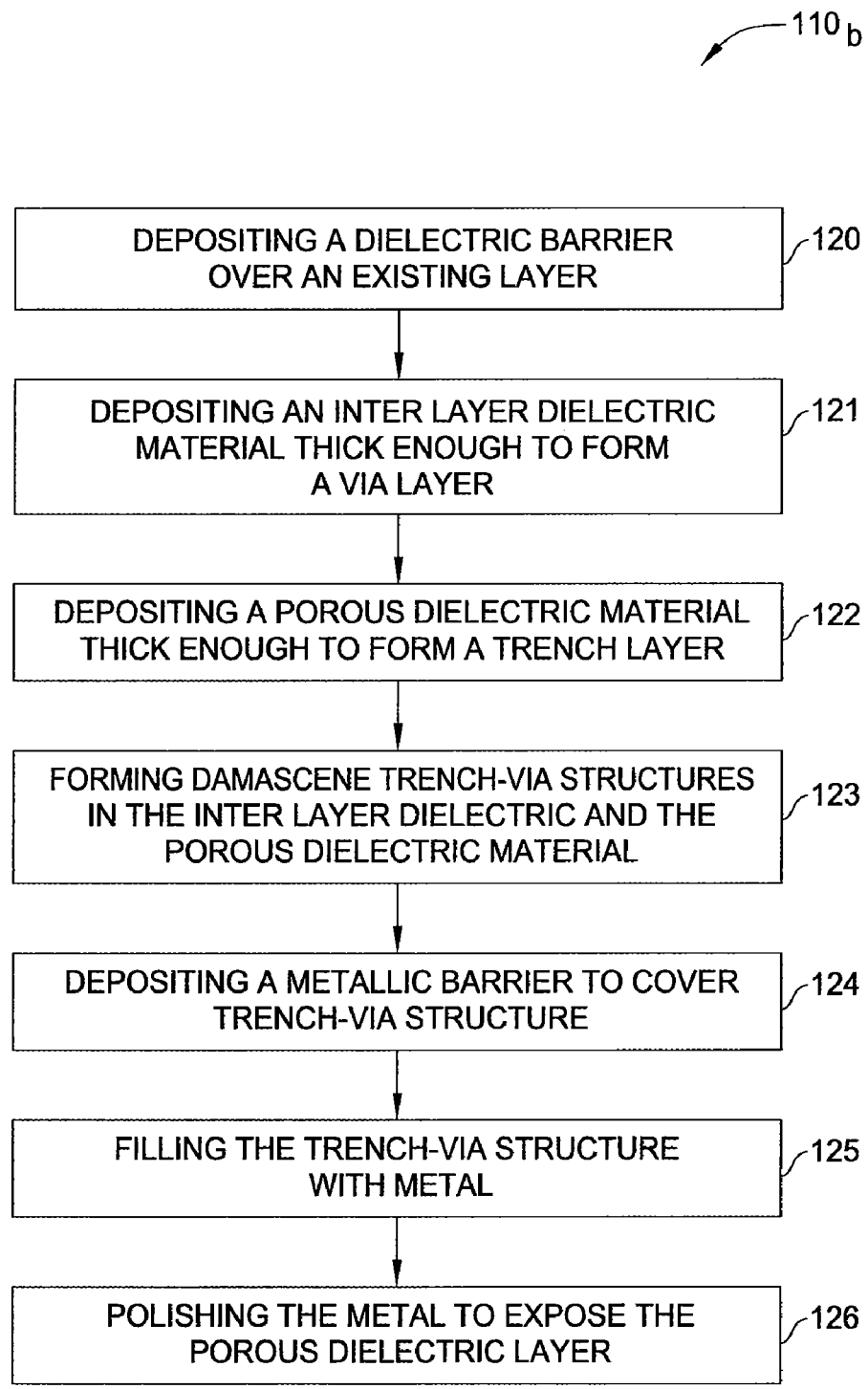
FIG. 2B a flow chart showing a process sequence for forming trench-via structures in accordance with another embodiment of the present invention.

Referring to FIG. 7, a via layer 250 and a trench layer 251 are formed above a preexisting layer 201, which includes a conductive line 210. FIG. 2B illustrates one process sequence 110b that may be used to form the via layer 250 and the trench layer 251 as shown.

In step 120 of the process sequence 110b, a dielectric barrier film 252 is deposited all over the preexisting layer 201. The dielectric barrier film 252 is configured to prevent diffusion of conductive materials, for example metals for the conductive line 210, into a subsequent dielectric layer. The dielectric barrier film 252 generally comprises a barrier dielectric material, such as silicon nitride, silicon oxycarbide, or amorphous hydrogenated silicon carbide (BLOk™).

In step 121, an interlayer dielectric material 253 is deposited above the dielectric barrier film 252. The interlayer dielectric material 253 has a thickness enough to form the via layer 250 therein. The interlayer dielectric material 253 may comprises carbon doped silicon dioxide or nitrogen doped silicon dioxide. A detailed description of formation of the interlayer dielectric 253 may be found in the U.S. Pat. No. 6,054,379, entitled "Method of Depositing a Low K Dielectric with Organo Silane", which is incorporated herein by reference.

In step 122, a porous low k dielectric material 254 is formed over the interlayer dielectric 253. The porous low k dielectric material 254 has a thickness enough to form the trench layer 251 therein.

In step 123, trench-via structures are formed in the interlayer dielectric material 253 and the porous low k dielectric material 254.

In step 124, a metallic diffusion barrier 255 is lined on the surface of the trench-via structure. The metallic diffusion barrier 255 is configured to prevent diffusion between metal lines subsequently deposited in the trenches and the dielectric structures nearby. The metallic diffusion barrier 255 may comprise tantalum (Ta) and/or tantalum nitride (TaN).

In step 125, the trench-via structures is filled with conductive lines 256 comprising one or more metals.

In step 126, a CMP process is performed on the conductive lines 256, the metallic diffusion barrier 255 so that the porous low k dielectric 254 is exposed on a top surface 257, as shown in FIG. 7.

Upon the formation the via layer 250 and the trench layer 251, portions of the porous low k dielectric 254 in the trench layer 251 may be removed so that air gaps may be formed between the conductive lines 256 using E-beam treatment via a pattern formed in a dielectric barrier 258 and a hard mask 259. The process sequence 130a shown in FIG. 3A may be used to remove the porous low k dielectric 254 forming reversed trenches 260 as shown in FIG. 8A.

Figure 4A:
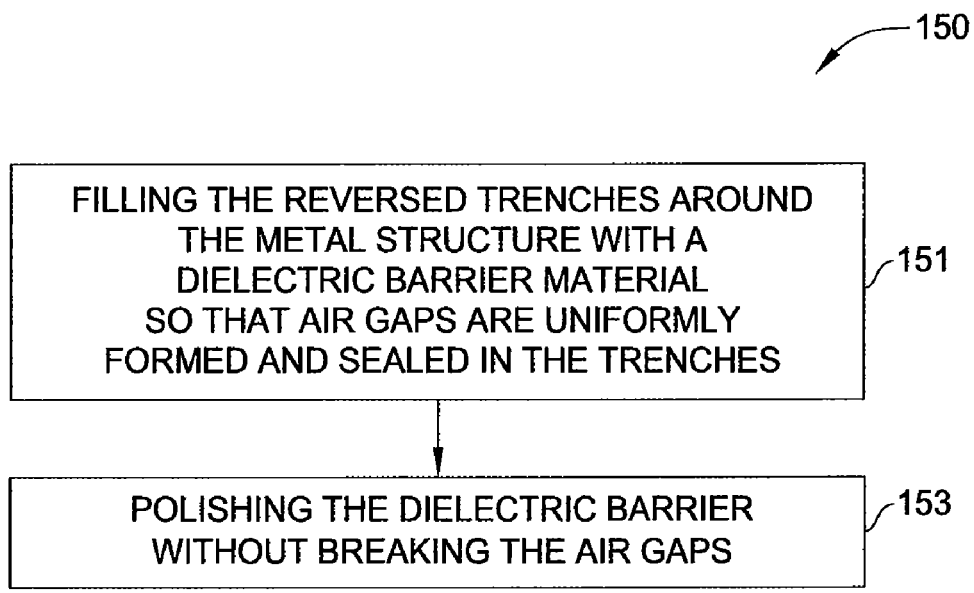
FIG. 4A is a flow chart showing a process sequence for forming a dielectric layer having air gaps in accordance with one embodiment of the present invention.
Figure 4B:
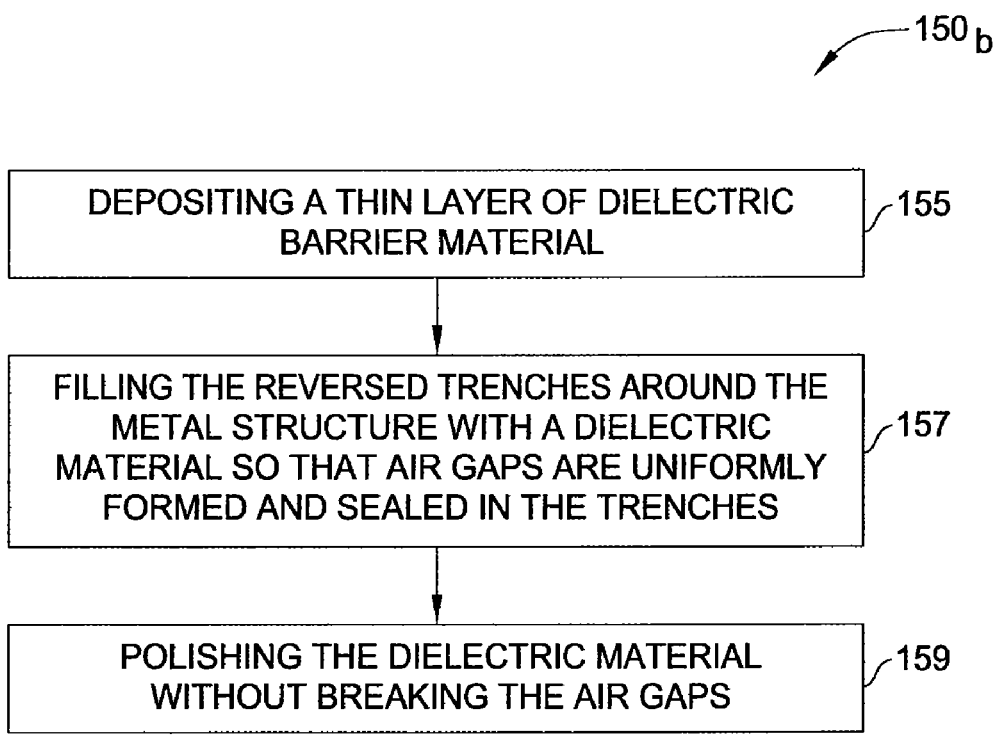
FIG. 4B is a flow chart showing a process sequence for forming a dielectric layer having air gaps in accordance with another embodiment of the present invention.

After formation of the reversed trenches 260, air gaps 263 may be formed using the process sequence 150a shown in FIG. 4A or the process sequence 150b shown in FIG. 4B. FIG. 8B illustrates air gaps 263 formed using the process sequence 150b shown in FIG. 4B. A thin layer of dielectric barrier 261 is lined in the reversed trenches 260. The air gaps 263 are formed in the reversed trenches 260 due to the non-conformality of the deposition process of an interlayer dielectric 262, wherein a deposition rate on the side walls is relatively slow compared to the deposition rate near the entrance of the reversed trenches 260 "pinching off" the entrance before the reversed trenches 260 are filled.

Embodiment 4

Figure 9A:
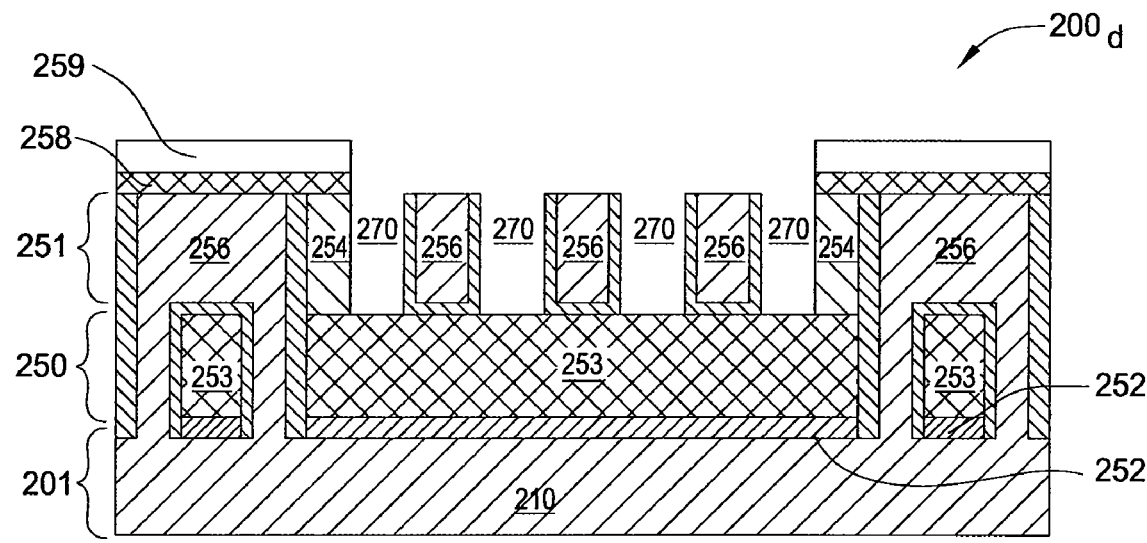
FIGS. 9A-B schematically illustrate formation of a substrate stack having air gaps in accordance with one embodiment of the present invention.
Figure 9B:
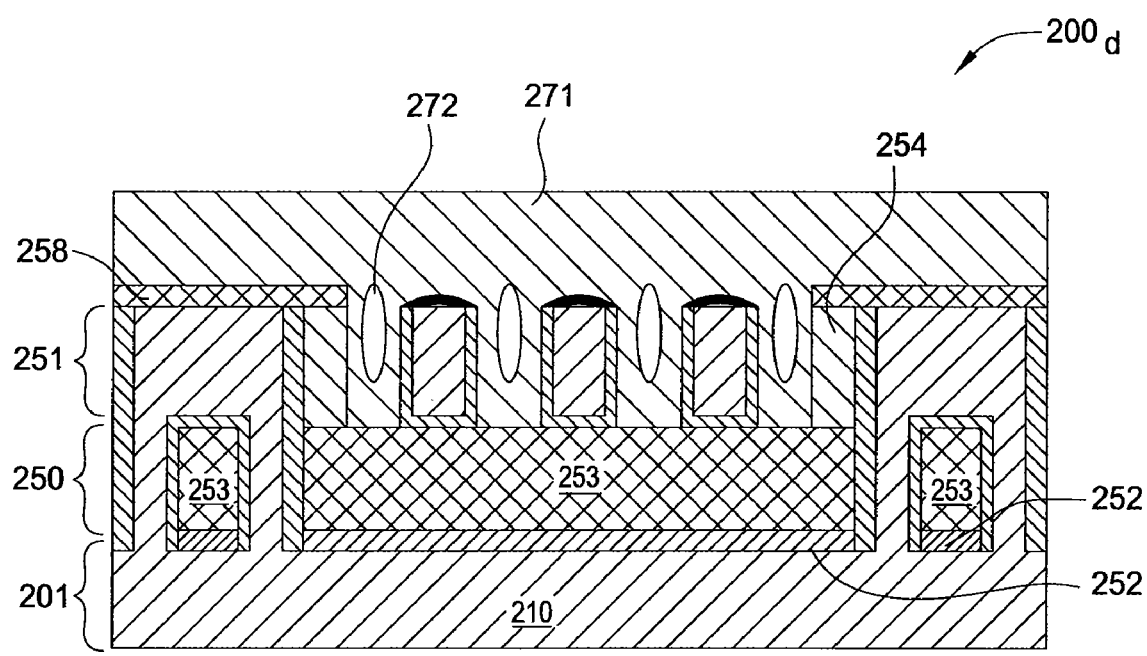

FIG. 7 and FIGS. 9A-9B schematically illustrate formation of a substrate stack 200d having air gaps in accordance with one embodiment of the present invention.

As shown in FIG. 7, the via layer 250 and the trench layer 251 are formed using the process sequence 110b of FIG. 2B. The via layer 250 based on the interlayer dielectric 253. The trench layer 251 is based on the porous low k dielectric layer 254.

Due to the property difference of the interlayer dielectric 253 and the porous low k dielectric layer 254, the interlayer dielectric 253 may be used as an etch stop while removing the porous low k dielectric layer 254 to form reversed trenches 270, as show in FIG. 9A, and described in step 143 of process sequence 130b. The reversed trenches 270 may be formed using a masked dry etching process to remove any porous low k dielectric 254 in selected regions.

After formation of the reversed trenches 270, air gaps 272 may be formed using the process sequence 150a shown in FIG. 4A or the process sequence 150b shown in FIG. 4B. FIG. 9B illustrates air gaps 272 are formed in the reversed trenches 270 due to the non-conformality of the deposition process of an interlayer dielectric 271, wherein a deposition rate on the side walls is relatively slow compared to the deposition rate near the entrance of the reversed trenches 270 "pinching off" the entrance before the reversed trenches 270 are filled.

In another embodiment, air gaps may be formed in trenches with sloped sidewalls to facilitate formation of air gaps. For example, air gaps may be formed while filling dielectric materials in trenches that have entrances narrower than bottoms. Detailed description regarding forming air gaps in trenches with sloped sidewalls may be found in U.S. patent application Ser. No. 11/869,409, filed Oct. 9, 2007, entitled "Method for Forming an Air Gap in Multilevel Interconnect Structures", which is incorporated herein by reference.

While the foregoing is directed to embodiments of the present invention, other and further embodiments of the invention may be devised without departing from the basic scope thereof, and the scope thereof is determined by the claims that follow.

What is claimed is:

1. A method for forming a semiconductor structure, comprising:
   depositing a first dielectric layer on a substrate;
   forming trenches in the first dielectric layer;
   filling the trenches with a conductive material;
   planarizing the conductive material to expose the first dielectric layer;
   depositing a dielectric barrier film on the conductive material and exposed first dielectric layer;
   depositing a hard mask layer over the dielectric barrier film;
   forming a pattern in the dielectric barrier film and the hard mask layer to expose selected regions of the substrate;
   oxidizing at least a portion of the first dielectric layer in the selected region of the substrate;
   removing the oxidized portion of the first dielectric layer to form reversed trenches around the conductive material; and
   forming air gaps in the reversed trenches while depositing a second dielectric material in the reversed trenches.

2. The method of claim 1, wherein the first dielectric layer comprises a porous low k dielectric material.

3. The method of claim 1, wherein depositing the first dielectric layer comprises:
   depositing a silicon/oxygen containing material having labile organic group; and
   curing the silicon/oxygen containing material to form microscopic gas pockets uniformly dispersed in the first dielectric layer.

4. The method of claim 1, further comprising lining the reversed trenches with a dielectric barrier prior to depositing the second dielectric material.

5. The method of claim 1, wherein oxidizing the first dielectric layer comprises treating the first dielectric material with electron beams.

6. The method of claim 5, wherein treating the first dielectric material using electron beams comprises controlling depth of the treatment.

7. The method of claim 5, wherein treating the first dielectric material using electron beams comprises adjusting a cathode voltage to control thickness of the first dielectric being treated.

8. The method of claim 5, wherein treating the first dielectric material with electron beams is performed in an ambient comprising at least one of argon or oxygen.

9. The method of claim 1, wherein oxidizing the first dielectric layer comprises treating the first dielectric material with ultra violet (UV) energy in one of inert ambient or oxygen ambient.

10. The method of claim 1, wherein the second dielectric material comprises a dielectric barrier material deposited non-conformally in the reversed trenches so that the air gaps are formed and sealed within the dielectric barrier material.

11. The method of claim 1, wherein the second dielectric material comprises an interlayer dielectric material deposited non-conformally in the reversed trenches so that the air gaps are formed and sealed within the interlayer dielectric material.

12. A method for forming a dielectric structure having air gaps, comprising:
   depositing a porous dielectric layer on a substrate;

forming trenches in the porous dielectric layer;
filling the trenches with a conductive material;
planarizing the conductive material to expose the porous dielectric layer;
depositing a dielectric barrier film on the conductive material and exposed porous dielectric layer;
depositing a hard mask layer over the dielectric barrier film;
forming a pattern in the dielectric barrier film and the hard mask layer to expose selected regions of the substrate;
treating the substrate using electron beams to oxidize at least a portion of the porous dielectric layer in the selected regions;
removing oxidized portion of the porous dielectric layer to form reversed trenches around the conductive material; and
forming air gaps in the reversed trenches while depositing a dielectric material in the reversed trenches.

13. The method of claim 12, wherein treating the substrate using electron beams comprises oxidizing a desired thickness of the porous dielectric layer.

14. The method of claim 13, wherein the desired thickness is controlled by adjusting a voltage applied to a cathode of an electron beam processing chamber.

15. The method of claim 12, wherein the depositing a porous dielectric layer comprises:
depositing a silicon/oxygen containing material having labile organic group; and
curing the silicon/oxygen containing material to form microscopic gas pockets uniformly dispersed in the dielectric layer.

16. The method of claim 12, wherein the dielectric material in the reversed trenches is a dielectric barrier material deposited non-conformally in the reversed trenches so that the air gaps are formed and sealed within the dielectric barrier material.

17. The method of claim 12, wherein forming the air gaps comprises depositing the dielectric material non-conformally in the reversed trenches so that the air gaps are formed and sealed within the dielectric material.

* * * * *